United States Patent [19]
Shi et al.

[11] Patent Number: 5,972,247
[45] Date of Patent: Oct. 26, 1999

[54] ORGANIC ELECTROLUMINESCENT ELEMENTS FOR STABLE BLUE ELECTROLUMINESCENT DEVICES

[75] Inventors: Jianmin Shi, Webster; Chin H. Chen, Mendon; Kevin P. Klubek, Rochester, all of N.Y.

[73] Assignee: Eastman Kodak Company, Rochester, N.Y.

[21] Appl. No.: 09/045,597

[22] Filed: Mar. 20, 1998

[51] Int. Cl.$^6$ .............................. G02F 1/00; C09K 11/06; H01J 1/62
[52] U.S. Cl. ...................... 252/583; 252/301.16; 313/504
[58] Field of Search ............................... 252/583, 301.16; 313/504

[56] References Cited

U.S. PATENT DOCUMENTS

| | | |
|---|---|---|
| 3,172,882 | 3/1965 | Gurnee et al. . |
| 3,173,050 | 3/1965 | Gurnee et al. . |
| 3,180,730 | 4/1965 | Klupfel et al. . |
| 3,567,450 | 3/1971 | Brantly et al. . |
| 3,658,520 | 4/1972 | Brantly et al. . |
| 3,935,031 | 1/1976 | Adler . |
| 4,356,429 | 10/1982 | Tang . |
| 4,539,507 | 9/1985 | VanSlyke et al. . |
| 4,720,432 | 1/1988 | VanSlyke et al. . |
| 4,769,292 | 9/1988 | Tang et al. . |
| 4,885,211 | 12/1989 | Tang et al. . |
| 4,950,950 | 8/1990 | Perry et al. . |
| 5,047,687 | 9/1991 | VanSlyke . |
| 5,059,861 | 10/1991 | Littman et al. . |
| 5,059,862 | 10/1991 | VanSlyke et al. . |
| 5,061,569 | 10/1991 | VanSlyke et al. . |
| 5,069,975 | 12/1991 | Nakada et al. . |
| 5,073,446 | 12/1991 | Scozzafava et al. . |
| 5,104,740 | 4/1992 | Shinkai et al. . |
| 5,122,711 | 6/1992 | Wakimoto et al. . |
| 5,126,214 | 6/1992 | Tokailin et al. . |
| 5,141,671 | 8/1992 | Bryan et al. . |
| 5,142,343 | 8/1992 | Hosokawa et al. . |
| 5,150,006 | 9/1992 | VanSlyke et al. . |
| 5,151,629 | 9/1992 | VanSlyke . |
| 5,227,252 | 7/1993 | Murayama et al. . |
| 5,256,945 | 10/1993 | Imai et al. . |
| 5,366,811 | 11/1994 | Higashi et al. . |
| 5,389,444 | 2/1995 | Hosokawa et al. . |
| 5,458,977 | 10/1995 | Hosokawa et al. . |
| 5,536,949 | 7/1996 | Hosokawa et al. . |
| 5,759,444 | 6/1998 | Enokida et al. .................... 252/301.16 |
| 5,858,563 | 1/1999 | Sano et al. ............................. 313/504 |

FOREIGN PATENT DOCUMENTS

| | | |
|---|---|---|
| 786926 | 1/1977 | European Pat. Off. . |
| 681019 | 4/1995 | European Pat. Off. . |

OTHER PUBLICATIONS

Tang et al, Electroluminescence of doped organic thin films, J. Appl. Phys. 65(9) May 1, 1989, pp. 3610–3619.

Hamada et al, Influence of the Emission Site on the Running Durability of Organic Electroluminescent Devices, Jpn. J. Appl. Phys. Vol. 34 (1995), Pt. 2, No. 7A, pp. L824–L826.

Hosokawa et al, High efficient blue electroluminescence from a distyrylarylene emitting layer with a new dopant, Appl. Phys. Lett. 67 (26) Dec. 25, 1995, pp. 3853–3855.

Dresner, Double Injection Electroluminescence in Anthracene, RCA Review, Jun. 1969, pp. 322–334 (1969).

*Primary Examiner*—Philip Tucker
*Attorney, Agent, or Firm*—Raymond L. Owens

[57] ABSTRACT

An organic EL device including an anode, a cathode, and an organic electroluminescent element between the anode and the cathode; the organic electroluminescent element includes an organic material or a mixture thereof of 9,10-bis(3'5'-diaryl)phenyl anthracene derivatives.

9 Claims, 3 Drawing Sheets

ORGANIC ELECTROLUMINESCENT ELEMENTS FOR STABLE BLUE ELECTROLUMINESCENT DEVICES

FIELD OF THE INVENTION

The present invention relates to organic electroluminescent (EL) element. More specifically, this invention relates to the use of a novel class of organic material for producing efficient blue EL devices.

BACKGROUND OF THE INVENTION

Organic EL devices are known to be highly efficient and are capable of producing a wide range of colors. Useful applications such as flat-panel displays have been contemplated. The work on the improvement in organic EL devices such as color, stability, efficiency and fabrication methods have been disclosed in U.S. Pat. Nos: 4,356,429; 4,539,507; 4,720,432; 4,885,211; 5,151,629; 5,150,006; 5,141,671; 5,073,446; 5,061,569; 5,059,862; 5,059,861; 5,047,687; 4,950,950; 4,769,292; 5,104,740; 5,227,252; 5,256,945; 5,069,975; 5,122,711; 5,366,811; 5,126,214; 5,142,343; 5,389,444; 5,458,977; 5,536,949; and 5,683,823.

The organic EL device includes an organic EL element consisting of extremely thin layers (<1.0 micrometer in combined thickness) between the anode and the cathode. Herein, the organic EL element is defined as the organic composition between the anode and cathode electrodes. In a basic two-layer EL device structure, one organic layer of the EL element adjacent to the anode is specifically chosen to inject and transport holes, therefore, it is referred to as the hole transport layer, and the other organic layer is specifically chosen to inject and transport electrons, referred to as the electron transport layer. The interface between the two layers provides an efficient site for the recombination of the injected hole-electron pair and the resultant electroluminescence. There is also a three layer organic EL device which contains a light-emitting layer between the hole transport layer and electron transport layer that has been disclosed by Tang et al [J. Applied Physics, Vol. 65, Pages 3610–3616, 1989]. The light-emitting layer commonly consists of a host material doped with a guest material. The host materials in light-emitting layer can be electron transport materials, such as 8-hydroxyquinoline aluminum complex [U.S. Pat. No. 4,769,292], the hole transport materials, such as aryl amines [Y. Hamada, T. Sano, K. Shibata and K. Kuroki, Jpn. J. Appl. Phys. 34, 824,1995], or the charge injection auxiliary materials, such as stilbene derivatives [C. Hosokawa et al., Appl. Phys. Lett., 67(25) 3853, 1995]. The doped guest materials, also known as the dopant, is usually chosen from highly fluorescent dyes. In the three layer organic EL device, the light-emitting layer provides an efficient site for the recombination of the injected hole-electron pair followed by the energy transfer to the guest material and produces the highly efficient electroluminescence.

In general, the host material in the light emitting layer should be as fluorescent as possible and the fluorescence wavelength should be in the blue or near the UV region. The latter attribute is important for down-shifting of the EL emission wavelength in a host-guest emitter layer. Among the blue fluorescent materials, 9,10-(diphenyl)anthracene has a near unity fluorescence quantum efficiency in solution. This compound is also highly fluorescent in the solid state. However, as a host material for the EL emitter layer, the film-forming property of 9,10-(diphenyl)anthracene is very poor, resulting in highly polycrystalline film which tends to produce electrical shorts in the EL device. Several improvements in 9,10-(diphenyl)anthracene have been disclosed. EP 0681019 disclosed the use of a dimeric structure of 9,10-(diphenyl)anthracene in improving the film-forming property and the solid fluorescence efficiency. EP 0786926 disclosed that the amino derivatives of 9,10-(diphenyl) anthracene are useful as emitters in organic EL device.

SUMMARY OF THE INVENTION

The present invention provides an organic EL device comprising an anode, a cathode, and an organic electroluminescent element between the anode and the cathode; the organic electroluminescent element includes an organic material or a mixture thereof having the structure:

wherein:
substituents $R^1$, $R^2$, $R^3$, and $R^4$ are each individually selected from the following groups consisting of:
Group 1:
  hydrogen, or alkyl of from 1 to 24 carbon atoms;
Group 2:
  aryl or substituted aryl of from 5 to 20 carbon atoms;
Group 3:
  carbon atoms necessary to complete a fused aromatic ring of naphthyl, anthracenyl, pyrenyl, or perylenyl;
Group 4:
  heteroaryl or substituted heteroaryl of from 5 to 24 carbon atoms;
Group 5:
  carbon atoms necessary to complete a fused heteroaromatic ring of furyl, thienyl, pyridyl, quinolinyl and other heterocyclic systems;
Group 6:
  alkoxyl, amino, alkyl amino, or aryl amino group of from 1 to 24 carbon atoms; and
Group 7:
  fluorine, chlorine, bromine or cyano.

In the present invention, organic electroluminescent (EL) elements, which belong to 9,10-bis(3'5'-diaryl)phenyl anthracene derivatives, provided a thermally stable, glassy, and highly fluorescent materials in condensed thin film which dramatically exhibits different physical properties than that of 9,10-diphenylanthracene. In 9,10-bis(3'5'-diaryl) phenyl anthracene molecule, it would exist a series of non-interconverting atropisomers due to the existence of the two phenyl-anthracene and four phenyl-aryl groups which have large energy barriers to internal rotation. It suggests the presence of polymorphic forms in solid form among this class of compounds. As a result, the film-forming property of 9,10-bis(3',5'-diaryl)phenyl anthracene is very good, resulting in highly fluorescent material in condensed thin film which is suitable for use in the light-emitting layer to produce an bright blue emission with long operational stability.

BRIEF DESCRIPTION OF THE DRAWINGS

These and other advantages of this invention can be better appreciated by reference to the following detailed description considered in conjunction with the drawings in which.

DETAILED DESCRIPTION OF THE PREFERRED EMBODIMENTS

Figure 1:
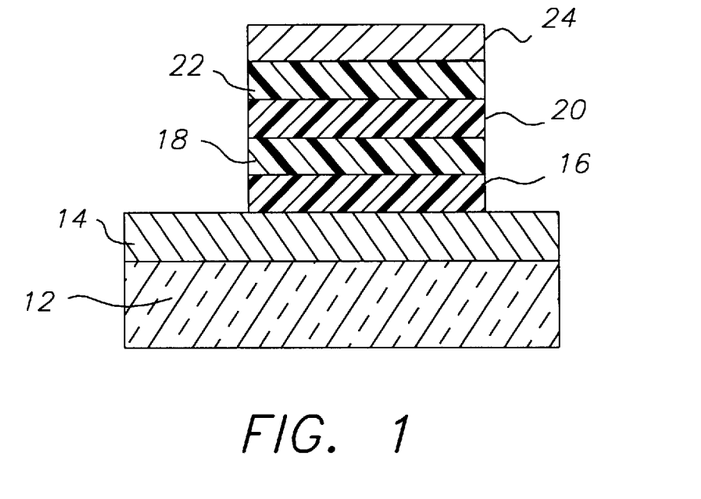
FIG. 1 shows schematic diagrams of the multi-layer structures of preferred EL devices of this invention.

Turning now to FIG. 1, an efficient blue emission and long life durability organic EL device 10 is shown. The device includes an anode 14 on a glass substrate 12, a hole injecting layer (HIL) 16, a hole transport layer (HTL) 18, a light-emitting layer (EML) 20, an electron transport layer (ETL) 22, and a cathode 24. All of the above layers can be provided by thin films. For the light emitting layer or film 20, its thickness is less than 1 micrometer. So for the purpose of this specification the terms "layer" and "film" are used interchangeably.

A hole injecting layer containing a porphyrinic compound forms the hole injecting layer (HIL) 16 of the organic EL device 10. A porphyrinic compound is any compound, natural or synthetic, which is derived from or includes a porphyrin structure, including porphine itself. Any of the prophyrinic compounds disclosed by Adler, U.S. Pat. No. 3,935,031 or commonly-assigned Tang U.S. Pat. No. 4,356,429, the disclosures of which are here incorporated by reference, can be employed.

Preferred porphyrinic compounds are those of structural formula (II):

wherein
Q is —N =or—C(R)=;
M is a metal, metal oxide, or metal halide;
R is hydrogen, alkyl, aralkyl, aryl, or alkaryl; and
$T^1$ and $T^2$ represent hydrogen or together complete a unsaturated six member ring, which can include substituents, such as alkyl or halogen. Preferred six membered rings are those formed of carbon, sulfur, and nitrogen ring atoms. Preferred alkyl moieties contain from about 1 to 6 carbon atoms while phenyl constitutes a preferred aryl moiety.

In an alternative preferred form the porphyrinic compounds differ from those of structural formula (I) by substitution of two hydrogens for the metal atom, as indicated by formula (III):

Highly preferred examples of useful porphyrinic compounds are metal free phthalocyanines and metal containing phthalocyanines. While the porphyrinic compounds in general and the phthalocyanines in particular can contain any meal, the metal preferably has a positive valence of two or higher. Exemplary preferred metals are cobalt, magnesium, zinc, palladium, nickel, and, particularly, copper, lead, and platinum.

Illustrative of useful porphyrinic compounds are the following:
Prophine
1,10,15,20-tetraphenyl-21H,23H-porphine copper (II)
1,10,15,20-tetrapheyl-21H,23H-porphine zinc (II)
Copper phthlocyanine
Chromium phthalocyanine fluoride The hole transporting layer (HTL) 18 of the organic EL device 10 contains at least one hole transporting aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monarylamine, diarylamine, triarylamine, or a polymeric arylamine. Exemplary monomeric triarylamines are illustrated by Klupfel et al U.S. Pat. No. 3,180,730. Other suitable triarylamines substituted with vinyl or vinyl radicals and/or containing at least one active hydrogen containing group are disclosed by Brantley et al U.S. Pat. Nos. 3,567,450 and 3,658,520.

Another class of aromatic tertiary amines are those which include at least two aromatic tertiary amine moieties. Such compounds include those represented by structural formula (IV).

(IV)

wherein
 $Q^1$ and $Q^2$ are independently aromatic tertiary amine moieties and
 G is a linking group such as an arylene, cycloalkylene, or alkylene group of a carbon to carbon bond.

A preferred class of triarylamines satisfying structural formula (IV) and containing two triarylamine moieties are those satisfying structural formula (V):

(V)

where
 $R^1$ and $R^2$ each independently represents a hydrogen atom, an aryl group, or an alkyl group or $R^1$ and $R^2$ together represent the atoms completing a cycloalkyl group and
 $R^3$ and $R^4$ each independently represents an aryl group which is in turn substituted with a diaryl substituted amino group, as indicated by structural formula (VI):

(VI)

wherein
 $R^5$ $R^6$ are independently selected aryl groups.

Another preferred class of aromatic tertiary amines are tetraaryldiamines. Preferred tetraaryldiamines include two diarylamino groups, such as indicated by formula (VII), linked through an arylene group:

(VII)

wherein
 Are is an arylene group,
 n is an integer of from 1 to 4, and
 Ar, $R^7$, $R^8$, and $R^9$ are independently selected aryl groups.

The various alkyl, alkylene, aryl, and arylene moieties of the foregoing structural formulae (IV), (V), (VII), can each in turn be substituted. Typical substituents including alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms-e.g., cyclopentyl, cyclohexyl, and cycloheptyl ring structures. The aryl and arylene moieties are preferably phenyl and phenylene moieties.

Illustrative of useful hole transport compounds are the following:

The light-emitting layer (EML) 20 of the organic EL device 10 comprises of a luminescent or fluorescent material where electroluminescence is produced as a result of electron-hole pair recombination in this region. In the practice of the present invention, the simplest construction comprises of a single component the host material forming the EL light-emitting layer 20 where light is emitted in response to electron-hole recombination comprises of a 9,10-bis(3'5'-diaryl)phenyl anthracene derivatives:

wherein:
$R^1$, $R^2$, $R^3$, and $R^4$ are selected from the following groups consisting of:

Group 1:
respectively hydrogen, or alkyl of from 1 to 24 carbon atoms;

Group 2:
aryl or substituted aryl of from 5 to 20 carbon atoms;

Group 3:
carbon atoms necessary to complete a fused aromatic ring, for example, naphthyl, anthracenyl, pyrenyl, perylenyl;

Group 4:
heteoaryl or substituted heteroaryl of from 5 to 24 carbon atoms;

Group 5:
carbon atoms necessary to complete a fused heteroaromatic ring, for example, furyl, thienyl, pyridyl, quinolinyl and other heterocyclic systems;

Group 6:
alkoxyl, alkenoxyl, amino, alkyl amino, or an arylamino group of from 1 to 24 carbon atoms; and Group 7:
fluorine, chlorine, bromine or cyano groups.

As the specific 9,10-bis(3'5'-diaryl)phenyl anthracene derivatives represented by the general formula I, the following Compounds Nos 1–42 are typical examples of the present invention, while it is understood that the present invention shall not be limited to these compounds.

The compounds belonging to Group 1 include Nos 1–9

1

-continued

2

3

4

5

6

7

8

9

The compounds belonging to Group 2 include Nos 10–12

10

11

12

15

The compounds belonging to Group 3 include Nos 13–18

13

16

14

17

18

21

The compounds belonging to Group 4 include Nos 19–25

19

22

20

23

The compounds belonging to Group 5 include Nos 26–30

31

The compounds belonging to Group 6 include Nos 32–40

32

33

34

35

36

37

-continued

The compounds belonging to Group 7 include Nos 41–42

A preferred embodiment of the light emitting layer 20 comprises a multi-component material consisting of a host material doped with one or more components of fluorescent dyes or electron trapping agents. Using this method, highly efficient EL devices can be constructed. Simultaneously, the color of the EL devices can be tuned by using fluorescent dyes of different emission wavelengths in a common host material. This dopant scheme has been described in considerable details for EL devices using Alq as the host material by Tang et al [J. Applied Physics, Vol. 65, Pages 3610–3616, 1989; U.S. Pat. No 4,769,292].

An important relationship for choosing a fluorescent dye as a dopant capable of modifying the hue of light emission when present in a host material is a comparison of their bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material. An advantage of using a blue host such as 9,10-bis(3'5'-diaryl)phenyl anthracene is that its bandgap is sufficiently large to effect energy transfer to a range of commonly available fluorescent dyes emitting in the blue. These blue dopants includes arylamines, coumarins, stilbenes, distrylstilbenes, derivatives of anthracene, tetracene, perylene, and other conjugated benzenoids. Other dopants for EL emissions at longer wavelengths include coumarins, rhodamines and other green or red emitting fluorescent dyes.

Preferred materials for use in forming the electron transporting layer (ETL) 22 of the organic EL device 10 of this invention are metal chelated oxinoid compounds, including chelates of oxine itself (also commonly referred to as 8-quinolinol or 8-hydroxyquinoline). Such compounds exhibit both high levels of performance and are readily fabricated in the form of thin films. Exemplary of contemplated oxinoid compounds are those satisfying the following structural formula:

wherein
  Me represents a metal;
  n is an integer of from 1 to 3; and
  Z independently in each occurrence represents the atoms completing a nucleus having at least two fused aromatic rings.

From the foregoing it is apparent that the metal can be monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is preferably maintained at 18 or less.

Illustrative of useful chelated oxinoid compounds are the following:
  Aluminum trisoxine [a.k.a, tris(8-quinolinol)aluminum]
  Magnesium bisoxine [a.k.a. bis(8-quinolinol)-magnesium]
  Indium trisoxine [a.k.a., tris(8-quinolinol)indium]
  Lithium oxine (a.k.a., 8-quinolinol lithium)

The preferred materials for the multi-layers of the organic EL device 10 are each capable of film-forming—that is, capable of being fabricated as a continuous layer having a thickness of less than 1 micrometer. A preferred method for forming the organic EL device 10 is by vacuum vapor deposition. Extremely thin defect-free continuous layers can be formed by this method. Specifically, the individual layer thickness as low as about 50 Angstroms can be constructed while still realizing satisfactory EL device performance. It is generally preferred that the overall thickness of the organic EL medium be at least about 1000 Angstroms.

Other methods for forming thin films in EL devices of this invention include spin-coating from a solution containing the EL material. A combination of spin-coating method and vacuum vapor deposition method is also useful for the fabrication of multi-layer EL devices.

The anode 14 and cathode 24 of the organic EL device 10 can each take any convenient conventional form. Where it is intended to transmit light from the organic EL device 10 through the anode 14, this can be conveniently achieved by coating a hole injecting layer 16 onto a light transparent substrate—e.g., a transparent or substantially transparent glass plate or plastic film. In one form the organic EL devices of this invention can follow the historical practice of including a light transparent anode formed of tin oxide or indium tin oxide coated on a glass plate, as disclosed by Gurnee et al U.S. Pat. No. 3,172,862, Gurnee U.S. Pat. No. 3,173,050, Dresner "Double Injection Electroluminescence in Anthracene", RCA Review, Volume 30, pages 322–334, 1969; and Dresner U.S. Pat. No. 3,710,167 cited above.

The organic EL devices of this invention can employ a cathode constructed of any metal, including any high or low work function metal, heretofore taught to be useful for this purpose. Unexpected fabrication, performance, and stability advantages have been realized by forming the cathode of a combination of a low work function metal and at least one other metal. For further disclosure, see commonly-assigned U.S. Pat. No. 4,885,211 by Tang and Van Slyke, the disclosure of which is incorporated by reference herein.

EXAMPLES

The invention and its advantages are further illustrated by the specific examples as follows:

Example 1

Synthesis of 3.5-(diphenyl)bromobenzene

To a solution of 1,3,5-tribromobenzene (60.0 g, 0.19 mol) in 300 mL of dry tetrahydrofuran (THF) was added 0.5 g of bis-(triphenylphosphine)-palladium(II) chloride under nitrogen. After the solution was purged with dry nitrogen for 5 minutes, 175 mL of phenylmagnesium chloride (2.0 M in THF) was added through an addition funnel at room temperature under nitrogen. The reaction mixture was stirred overnight. Then it was quenched by slowly adding 50 mL of 0.5 N HCl with stirring. The solvents were removed via a rotary evaporator. The residue was dissolved in heptane and washed with 0.1 M HCl followed by water. After removal of solvents, crude residue were purified by chromatography on silica gel using 3% methanol in dichloromethane as eluents. After drying, 18.0 g of pure 3,5-(diphenyl)bromobenzene was collected. Yield 30.0%.

Example 2

Synthesis of 9,10-di-(3,5-diphenyl)phenyl anthracene (Compound 1)

To a suspension of 6.5 g (0.02 mol) of 9.10-dibromoanthracene and 0.5 g of bis-(triphenylphosphine)-palladium(II) chloride in 100 mL of dry THF at refluxing was added a solution of 3,5-(diphenyl)phenylmagnesium bromide, which was freshly prepared from 15.5 g (0.05 mol) of 3,5-(diphenyl)bromobenzene in 150 mL of dry THF and 1.5 g magnesium in 30 mL of dry THF with 1,2-dibromoethane as an initiator. After addition, the reaction mixture was maintained at reflux for three hours. Then it was cooled and 30 mL of water was carefully added. After removal of the solvents by vacuum rotary evaporator, the residue was extracted by dichloromethane followed by washing with dilute hydrochloric acid and water. The dichloromethane solution was dried over sodium sulfate and passed it through silica gel column. The solvents were removed.

The pure 9,10-di-(3',5'-diphenyl)phenyl anthracene (Compound 1) (9.5 g) was obtained by recrystallization from hexane. Yield 75.0%.

Example 3

Synthesis of 3,5-di-(o-tolyl)bromobenzene

To a solution of 1,3,5-tribromobenzene(47.3 g, 0.15 mol) in 150 mL of dry tetrahydrofuran (THF) was added 0.5 g of bis-(triphenylphosphine)-palladium(II) chloride under nitrogen. After the solution was degassed with dry nitrogen for 5 minutes, 155 mL of o-tolyl magnesium bromide (0.2 M in THF) was added through an addition funnel at 70° C. under nitrogen. The reaction mixture was stirred under reflux for another two hours after addition. After cooling the reaction mixture was quenched by slowly adding 50 mL of 0.5 N HCl with stirring. Then the solvents were removed via rotary evaporator. The residue was dissolved in hexane and washed with 0.1 M HCl followed by water. After removal of solvents, crude residue were purified by chromatography on silica gel using hexane as eluents. After drying, 28.0 g of 3,5-di-o-tolyl bromobenzene was collected. Yield 55.3%.

Example 4

Synthesis of 9,10-di-(3',5'-o-tolyl)phenyl anthracene (Compound 2)

To a suspension of 6.5 g (0.02 mol) of 9.10-dibromoanthracene and 0.5 g of bis-(triphenylphosphine)-palladium(II) chloride in 100 mL of dry THF at refluxing was added to a solution of 3,5-di(o-tolyl)phenylmagnesium bromide, which was freshly prepared from 15.5 g (0.046 mol) of 3,5-di-(o-tolyl)bromobenzene in 150 mL of dry THF and clean, dry 1.5 g magnesium in 30 mL of dry THF with 1,2-dibromoethane as an initiator. After the addition, the reaction mixture was kept at reflux for another three hours. Then the reaction mixture was cooled and 30 mL of water was carefully added. After removal of the solvents by vacuum rotary evaporator, the residue was extracted by dichloromethane followed by washing with dilute hydrochloric acid and water. The dichlomethane solution was dried over sodium sulfate and passed through a silica gel column. The pure 9,10-di-(3',5'-o-tolyl)-phenyl anthracene (Compound 2) (11.5 g) was obtained by recrystallization from 300 mL of hexane. Yield 76.8%.

Example 5

Synthesis of 3,5-(1-naphthyl)bromobenzene

To a solution of 1,3,5-tribromobenzene(105.0 g, 0.22 mol) in 500 mL of dry tetrahydrofuran (THF) was added 1.0 g of bis-(triphenylphosphine)-palladium(II) chloride under nitrogen. After the solution was bubbled with dry nitrogen for 5 minutes, 1-naphthylmagnesium bromide, which was prepared from 150.0 g (0.48 mol) of 1-bromonaphthalene in 100.0 mL of dry THF and clean, dry 18.0 g of magnesium in 250 mL of dry THF with 1,2-dibromoethane as an initiator, was added through an addition funnel at 70° C. under nitrogen. The reaction mixture was stirred under reflux for another two hours. After the reaction mixture was cooled, it was quenched by slowly adding 25.0 mL of 5% HCl with stirring. Then the solvents were removed via a rotary evaporator. The residue was dissolved in dichloromethane and washed with 0.1 M HCl followed by water. After removal of solvents, the crude residue were purified by crystallizing from heptane. A 57.0 g of pure 3,5-di(1-naphthyl)bromobenzene was collected. (yield 63.5%).

Example 6

Synthesis of 9,10-di-[(3,5-(1-naphthyl)]phenyl-anthracene (Compound 13)

Figure 2:
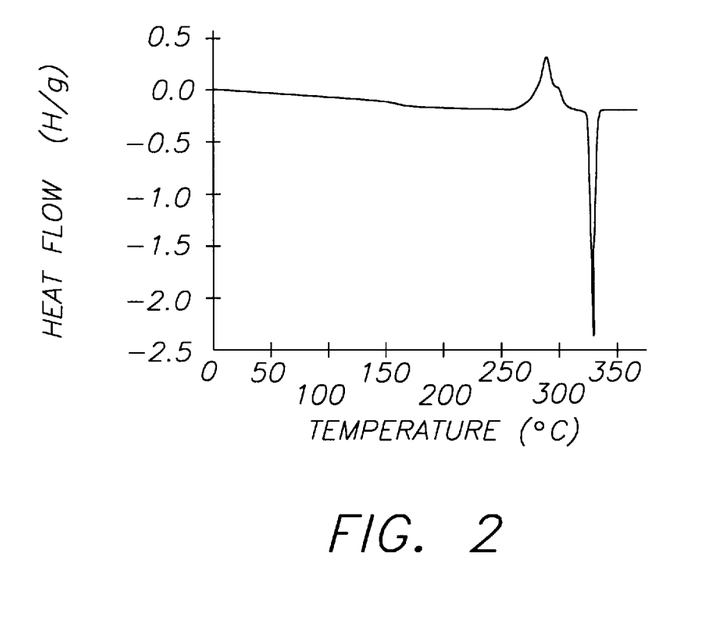
FIG. 2 shows Differential Scanning Calorimetry (DSC) measurement of compound 9,10-bis-[3'5'-(1-naphthyl)phenyl anthracene (Compound 13) of this invention in Example 6.
Figure 3:
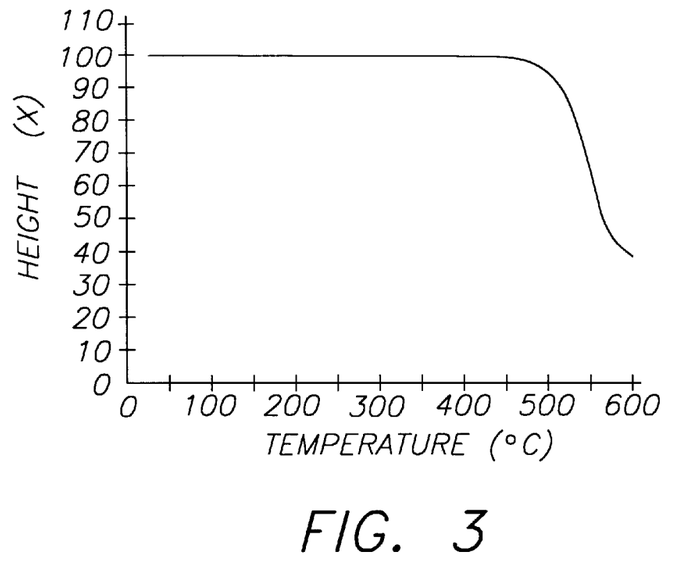
FIG. 3 shows Thermogravimetric Analysis (TGA) measurement of compound 9,10-bis-[3',5'-(1-naphthyl)phenyl anthracene (Compound 13) of this invention in Example 6.

To a suspension of 6.7 g (0.02 mol) of 9.10-dibromoanthracene and 0.3 g of bis-(triphenylphosphine)-palladium(II) chloride in 150 mL of dry THF heated at refluxing was added to a solution of 3,5-di-(1-naphthyl) phenylmagnesium bromide, which was freshly prepared from 18.4 g of (0.045 mol) of 3,5-di-(1-naphthyl)- bromobenzene in 150 mL of dry THF and clean, dry 1.5 g of magnesium in 30 mL of dry THF with 1,2-dibromoethane as an initiator. After the addition, the reaction mixture was kept at reflux for another three hours. Then the reaction mixture was cooled and 30 mL of 0.5% HCl was carefully added. After removal of the solvents by vacuum rotary evaporator, the residue was filtered and washed by water, 1:1 water:acetone, and followed by a minimum amount of dichlomethane. After drying, the pure 9,10-bis-[3',5'-(1-naphthyl)phenyl] anthracene (13) (12.5 g) was obtained. Yield 74.0%. The pure 9,10-bis-[3',5'-(1-naphthyl)phenyl] anthracene (Compound 13) is highly thermally stable, amorphorous material and its DSC and TGA data are showed in FIG. 2 and FIG. 3.

EL Device Fabrication and Performance

Example 7

An EL device 10 satisfying the requirements of the invention was constructed in the following manner. The organic EL device 10 has four organic layers, namely, a hole-injection layer 16, a hole transport layer 18, a light emitting layer 20, and an electron-transport layer 22.

a) An indium-tin-oxide (ITO) coated glass substrate 12 was sequentially ultrasonicated in a commercial detergent, rinsed in deionized water, degreased in toluene vapor and exposed to ultraviolet light and ozone for a few minutes.

b) A hole injection layer 16 of copper phthalocyanine (150 Angstroms) was then deposited on top of the ITO coated substrate 12 by evaporation from a tantalum boat.

c) Onto the copper phthalocyanine layer was deposited a hole transport layer 16 of N,N'-bis-(1-naphthyl)-N,N'-diphenylbenzidine (600 Angstroms), also by evaporation from a tantalum boat.

d) A light emitting layer 20 of 9,10-di-(3'5'-o-tolyl)-phenyl anthracene (Compound 2) (350 Angstroms) was then deposited onto the hole-transport layer 18.

e) A electron-transport layer 22 of Alq (350 Angstroms) was then deposited onto the light emitting layer 20.

f) On top of the Alq layer was deposited a cathode 24 (2000 Angstroms) formed of a 10:1 atomic ratio of Mg and Ag.

The above sequence completed the deposition of the EL device 10. The device was then hermetically packaged in a dry glove box for protection against ambient environment.

Figure 4:
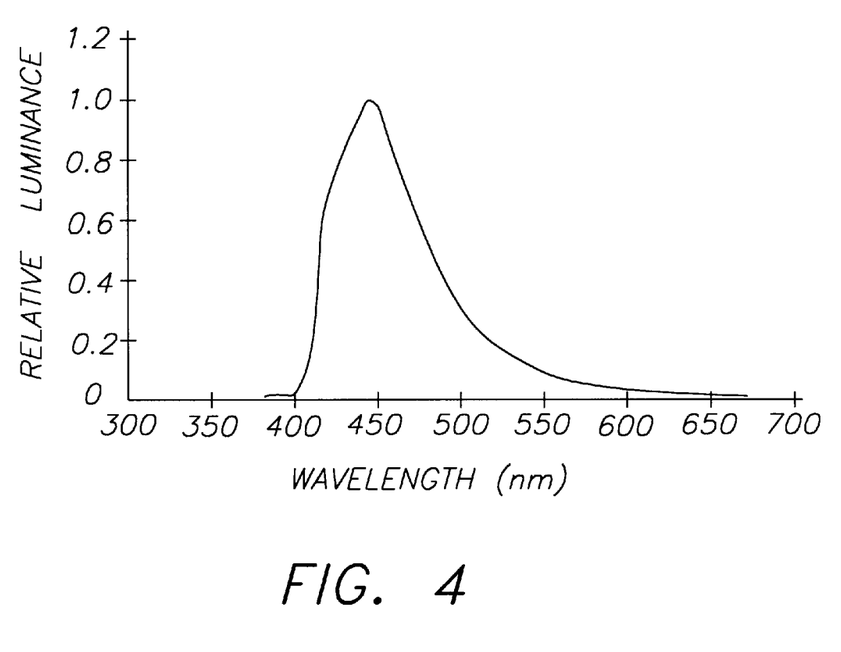
FIG. 4 shows the spectral characteristic of an EL device described in Example 7.

The light output from this EL device 10 was 200 cd/m$^2$ when it was driven by a current source of 20 mA/cm$^2$. The EL color is blue with 1931 CIE color coordinates of X=0.162 and Y=0.107. The EL spectrum shown in FIG. 4 has a peak emission at 448 nm.

Example 8

An EL device 10 in accordance with this invention was constructed in the same manner as in Example 7 by using the 9,10-bis-[3',5'-(1-naphthyl)phenyl] anthracene (Compound 13) as a light emitting layer 20.

a) An indium-tin-oxide (ITO) coated glass substrate 12 was sequentially ultrasonicated in a commercial detergent, rinsed in deionized water, degreased in toluene vapor and exposed to ultraviolet light and ozone for a few minutes.

b) A hole injection layer 16 of copper phthalocyanine (150 Angstroms) was then deposited on top of the ITO coated substrate 12 by evaporation from a tantalum boat.

c) Onto the copper phthalocyanine layer was deposited a hole transport layer 18 of N,N'-bis-(1-naphthyl)-N, N'diphenylbenzidine (600 Angstroms), also by evaporation from a tantalum boat.

d) A light emitting layer 20 of 9,10-bis-[3',5'-(1-naphthyl) phenyl anthracene (Compound 13) (350 Angstroms) was then deposited onto the hole-transport layer 18.

e) A electron-transport layer 22 of Alq (350 Angstroms) was then deposited onto the light emitting layer 20.

f) On top of the Alq layer was deposited a cathode 24 (2000 Angstroms) formed of a 10:1 atomic ratio of Mg and Ag.

The above sequence completed the deposition of the EL device 10. The device was then hermetically packaged in a dry glove box for protection against ambient environment.

Figure 5:
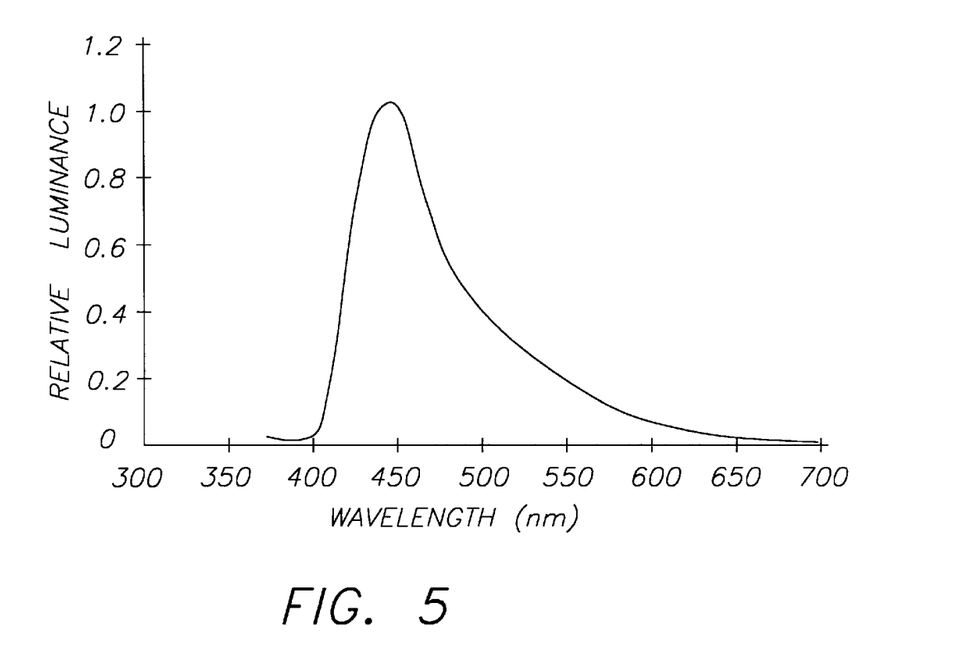
FIG. 5 shows the spectral characteristic of an EL device described in Example 8.

The light output from this EL device 10 was 278 cd/m$^2$ when it was driven by a current source of 20 mA/cm$^2$. The EL color is blue with 1931 CIE color coordinates of X=0.173 and Y=0.155. The EL spectrum shown in FIG. 5 has a peak emission at 448 nm.

Example 9

This example illustrates an organic EL device 10 where the EL device 10 contains a doped luminescent layer. The organic EL device 10 has four organic layers, namely, a hole-injection layer 16, a hole transport layer 18, a doped light emitting layer 20, and an electron-transport layer 22.

a) An indium-tin-oxide (ITO) coated glass substrate 12 was sequentially ultrasonicated in a commercial detergent, rinsed in deionized water, degreased in toluene vapor and exposed to ultraviolet light and ozone for a few minutes.

b) A hole injection layer 16 of copper phthalocyanine (150 Angstroms) was then deposited on top of the ITO coated substrate 12 by evaporation from a tantalum boat.

c) Onto the copper phthalocyanine layer was deposited a hole transport layer 18 of N,N'-bis-(1-naphthyl)-N,N'-diphenylbenzidine (600 Angstroms), also by evaporation from a tantalum boat.

d) A light emitting layer 20 of doped of 9,10-di-(3',5'-o-tolyl)-phenyl anthracene (Compound 2) (300 Angstroms) was then deposited onto the hole-transport layer 18. The doped layer contains 0.6% tetraphenyl pyrene which was co-deposited with the 9,10-di-(3'5'-o-tolyl)phenyl anthracene (Compound 2) to form a uniform doped light emitting layer 20.

e) A electron-transport layer 22 of Alq (350 Angstroms) was then deposited onto the light emitting layer 20.

f) On top of the Alq layer was deposited a cathode 24 (2000 Angstroms) formed of a 10:1 atomic ratio of Mg and Ag.

The above sequence completed the deposition of the EL device 10. The device was then hermetically packaged in a dry glove box for protection against ambient environment.

The light output from this EL device 10 was 222 cd/m$^2$ when it was driven by a current source of 20 mA/cm$^2$. The EL color is blue with 1931 CIE color coordinates of X=0.163 and Y=0.107. The EL spectrum has a peak emission at 444 nm.

Example 10

This example also illustrates an organic EL device 10 where the EL device 10 contains a doped luminescent layer. The organic EL device 10 has four organic layers, namely, a hole-injection layer 16, a hole transport layer 18, a doped light emitting layer 20, and an electron-transport layer 22.

a) An indium-tin-oxide (ITO) coated glass substrate 12 was sequentially ultrasonicated in a commercial detergent, rinsed in deionized water, degreased in toluene vapor and exposed to ultraviolet light and ozone for a few minutes.

b) A hole injection layer 16 of copper phthalocyanine (150 Angstroms) was then deposited on top of the ITO coated substrate by evaporation from a tantalum boat.

c) Onto the copper phthalocyanine layer was deposited a hole transport layer 18 of N,N'-bis-(1-naphthyl)-N,N'-diphenylbenzidine (600 Angstroms), also by evaporation from a tantalum boat.

d) A light emitting layer 20 of doped of 9,10-di-(3',5'-o-tolyl)-phenyl anthracene (Compound 2) (300 Angstroms) was then deposited onto the hole-transport layer 18. The doped layer contains 0.5% tetra-t-butyl perylene which was co-deposited with the 9,10-di-(3',5'-o-tolyl)-phenyl anthracene (Compound 2) to form a uniform doped light emitting layer 20.

e) An electron-transport layer 22 of Alq (350 Angstroms) was then deposited onto the light emitting layer 20.

f) On top of the Alq layer was deposited a cathode 24 (2000 Angstroms) formed of a 10:1 atomic ratio of Mg and Ag.

The above sequence completed the deposition of the EL device 10. The device was then hermetically packaged in a dry glove box for protection against ambient environment.

Figure 6:
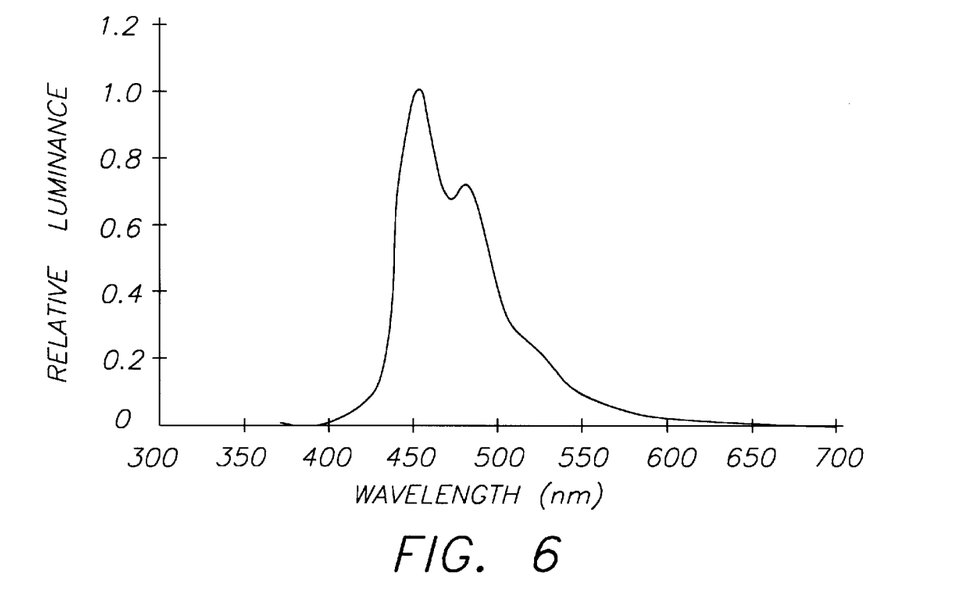
FIG. 6 shows the spectral characteristic of a doped EL device described in Example 10.

The light output from this EL device 10 was 410 cd/m$^2$ when it was driven by a current source of 20 mA/cm$^2$. The EL color is blue with 1931 CIE color coordinates of X=0.144 and Y=0.196. The EL spectrum shown in FIG. 6 has a peak emission at 464 nm. This EL spectrum indicates that EL emission originates from tetra-t-butyl perylene doped with the 9,10-di-(3',5'-tolyl)-phenyl anthracene (Compound 2) and is predominantly characteristic of the tetra-t-butyl perylene dopant.

These examples show that organic materials of 9,10-bis (3',5'-diaryl)phenyl anthracene derivatives can be effectively used in an organic electroluminescent device and these derivatives include:

wherein:

substituents $R^1$, $R^2$, $R^3$, and $R^4$ are each individually selected from the following groups consisting of:

Group 1:
    hydrogen, or alkyl of from 1 to 24 carbon atoms;
Group 2:
    aryl or substituted aryl of from 5 to 20 carbon atoms;
Group 3:
    carbon atoms necessary to complete a fused aromatic ring of naphthyl, anthracenyl, pyrenyl, or perylenyl;
Group 4:
    heteroaryl or substituted heteroaryl of from 5 to 24 carbon atoms;
Group 5:
    carbon atoms necessary to complete a fused heteroaromatic ring of furyl, thienyl, pyridyl, quinolinyl and other heterocyclic systems;
Group 6:
    alkoxyl, amino, alkyl amino, or aryl amino group of from 1 to 24 carbon atoms; and
Group 7:
    fluorine, chlorine, bromine or cyano.

The invention has been described in detail with particular reference to certain preferred embodiments thereof, but it will be understood that variations and modifications can be effected within the spirit and scope of the invention.

| PARTS LIST | |
|---|---|
| 10 | EL device |
| 12 | glass substrate |
| 14 | anode |
| 16 | hole injecting layer |
| 18 | hole transport layer |
| 20 | light-emitting layer |
| 22 | electron transport layer |
| 24 | cathode |

What is claimed is:

1. An organic EL device comprising an anode, a cathode, and an organic electroluminescent element between the anode and the cathode; the organic electroluminescent element includes an organic material or a mixture thereof having the structure:

wherein:
    substituents $R^1$, $R^2$, $R^3$, and $R^4$ are each individually selected from the following groups consisting of:
Group 1:
    hydrogen, or alkyl of from 1 to 24 carbon atoms;
Group 2:
    aryl or substituted aryl of from 5 to 20 carbon atoms;
Group 3:
    carbon atoms necessary to complete a fused aromatic ring of naphthyl, anthracenyl, pyrenyl, or perylenyl;
Group 4:
    heteroaryl or substituted heteroaryl of from 5 to 24 carbon atoms;
Group 5:
    a fused heteroaromatic ring of furyl, thienyl, pyridyl, or quinolinyl;
Group 6:
    alkoxyl, amino, alkyl amino, or aryl amino group of from 1 to 24 carbon atoms; and
Group 7:
    fluorine, chlorine, bromine or cyano.

2. An organic EL device comprising an anode, a cathode, and an organic electroluminescent element between the anode and the cathode; the organic electroluminescent element includes an organic material or a mixture thereof having the structure:

wherein:
    substituents $R^1$, $R^2$, $R^3$, and $R^4$ are each individually selected from the group consisting of hydrogen, or alkyl of from 1 to 24 carbon atoms.

3. An organic EL device comprising an anode, a cathode, and an organic electroluminescent element between the anode and the cathode; the organic electroluminescent element includes an organic material or a mixture thereof having the structure:

wherein:
    substituents $R^1$, $R^2$, $R^3$, and $R^4$ are each individually selected from the group consisting of aryl or substituted aryl of from 5 to 20 carbon atoms.

4. An organic EL device comprising an anode, and an organic electroluminescent element between the anode and the cathode; the organic electroluminescent element includes an organic material or a mixture thereof having the structure:

wherein:
substituents $R^1$, $R^2$, $R^3$, and $R^4$ are each individually selected to complete a fused aromatic ring.

5. The organic EL device of claim 4 wherein the fused automatic ring is naphthyl, anthracenyl, pyrenyl, or perylenyl.

6. An organic EL device comprising an anode, a cathode, and an organic electroluminescent element between the anode and the cathode; the organic electroluminescent element includes an organic material or a mixture thereof having the structure:

wherein:
substituents $R^1$, $R^2$, $R^3$, and $R^4$ are each individually selected from the group consisting of heteoaryl or substituted heteroaryl of from 5 to 24 carbon atoms necessary to complete a fused aromatic ring.

7. The organic EL device according to claim 6, wherein the fused aromatic ring is furyl, thienyl, pyridyl, or quinolinyl.

8. An organic EL device comprising an anode, a cathode, and an organic electroluminescent element between the anode and the cathode; the organic electroluminescent element includes an organic material or a mixture thereof having the structure:

wherein:
substituents $R^1$, $R^2$, $R^3$, and $R^4$ are each individually selected from the group consisting of alkoxyl, amino, alkyl amino, or an arylamino group of from 1 to 24 carbon atoms.

9. An organic EL device comprising an anode, a cathode, and an organic electroluminescent element between the anode and the cathode; the organic electroluminescent element includes an organic material or a mixture thereof having the structure:

wherein:
substituents $R^1$, $R^2$, $R^3$, and $R^4$ are each individually selected from the group consisting of fluorine, chlorine, bromine or cyano groups.

* * * * *